United States Patent
Grassi et al.

(10) Patent No.: US 12,352,807 B2
(45) Date of Patent: Jul. 8, 2025

(54) ULTRA-COMPACT AND MICROPOWER CIRCUIT TO MONITOR PROCESS, VOLTAGE, AND TEMPERATURE WITH HIGH ACCURACY

(71) Applicant: Avago Technologies International Sales Pte. Limited, Singapore (SG)

(72) Inventors: Alberto Grassi, Foothill Ranch, CA (US); Saurabh Surana, Irvine, CA (US); Ullas Singh, Irvine, CA (US); Namik Kocaman, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 184 days.

(21) Appl. No.: 18/130,332

(22) Filed: Apr. 3, 2023

(65) Prior Publication Data
US 2024/0329112 A1    Oct. 3, 2024

(51) Int. Cl.
*G01R 31/28* (2006.01)
*H03K 17/687* (2006.01)

(52) U.S. Cl.
CPC ..... *G01R 31/2831* (2013.01); *G01R 31/2837* (2013.01); *H03K 17/687* (2013.01)

(58) Field of Classification Search
CPC ............ G01R 31/2831; G01R 31/2837; G01R 31/2856; G01R 31/30; G01R 31/2882; H03K 17/687; H03K 3/011; H03K 3/0315
USPC .................................................... 324/762.05
See application file for complete search history.

(56) References Cited

U.S. PATENT DOCUMENTS

| | | | |
|---|---|---|---|
| 8,058,859 B2 | 11/2011 | Xu | |
| 9,621,036 B2 | 4/2017 | Wibben | |
| 2011/0127981 A1 | 6/2011 | Miyamae | |
| 2012/0038427 A1 | 2/2012 | Stoiber et al. | |
| 2014/0049310 A1* | 2/2014 | Joo ........................ | G11C 29/028 327/407 |
| 2015/0194880 A1* | 7/2015 | Wibben ................. | H02M 3/156 323/282 |
| 2017/0038264 A1* | 2/2017 | Odedara .................. | G01K 7/32 |

(Continued)

OTHER PUBLICATIONS

European Search Report on non-Foley case related to U.S. Appl. No. 18/130,332 Dtd Sep. 3, 2024.

(Continued)

*Primary Examiner* — Tung X Nguyen
*Assistant Examiner* — Robert P Alejnikov, Jr.
(74) *Attorney, Agent, or Firm* — Foley & Lardner LLP

(57) ABSTRACT

A device includes a circuit that generates a first current associated with a voltage of a region of a semiconductor substrate, a second current associated with a temperature of the region, a third current associated with a first process parameter of the region, and a fourth current associated with a second process parameter of the region. A multiplexer of the device receives the first, second, third, and fourth currents and selects the currents one by one and periodically. A ring oscillator of the device is coupled to the multiplexer and receives the first, second, third, and fourth currents one by one and periodically, from the multiplexer. The ring oscillator oscillates at oscillation frequencies that are based on the received current from the multiplexer. The voltage, temperature, and the first and second process parameters of the region are determined based on the oscillation frequencies.

20 Claims, 10 Drawing Sheets

(56) References Cited

U.S. PATENT DOCUMENTS

| | | | | |
|---|---|---|---|---|
| 2017/0187358 A1* | 6/2017 | Takeuchi | ........... | G01R 31/2856 |
| 2018/0034452 A1 | 2/2018 | Lu et al. | | |
| 2018/0062509 A1* | 3/2018 | Duong | ................. | H02M 3/156 |
| 2019/0028090 A1* | 1/2019 | Rao | ........................ | H03K 3/017 |
| 2020/0333393 A1* | 10/2020 | Fayneh | .................... | G01K 7/00 |

OTHER PUBLICATIONS

European Search Report on non-Foley case related to U.S. Appl. No. 18/122,636 Dtd Jul. 25, 2024.

Non-Final Office Action on U.S. Appl. No. 18/122,636 DTD Apr. 17, 2025.

* cited by examiner

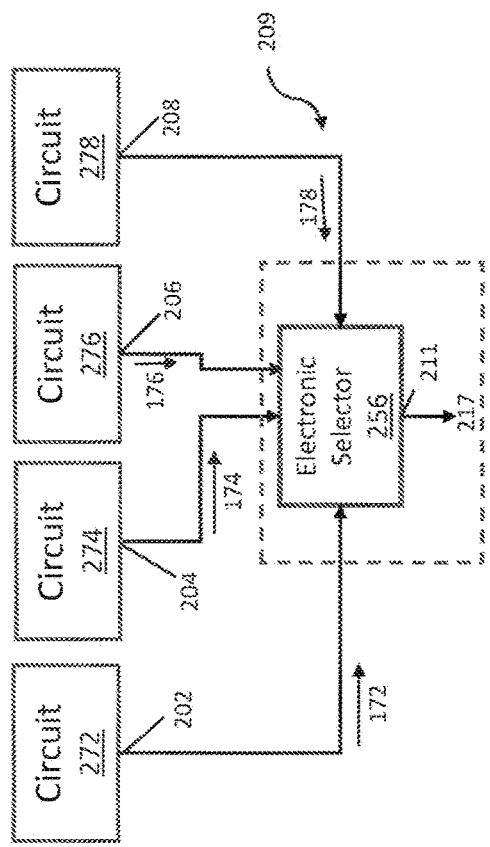
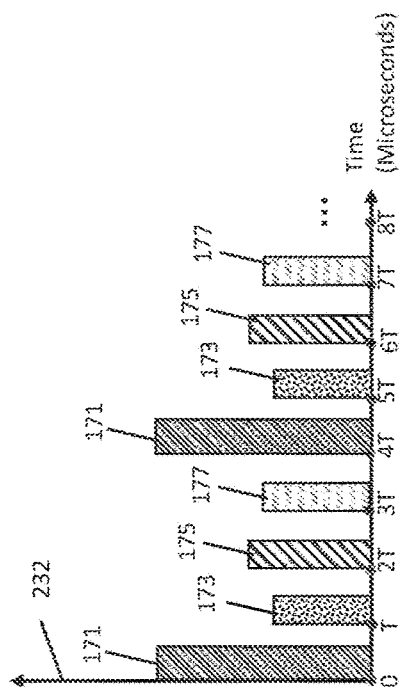
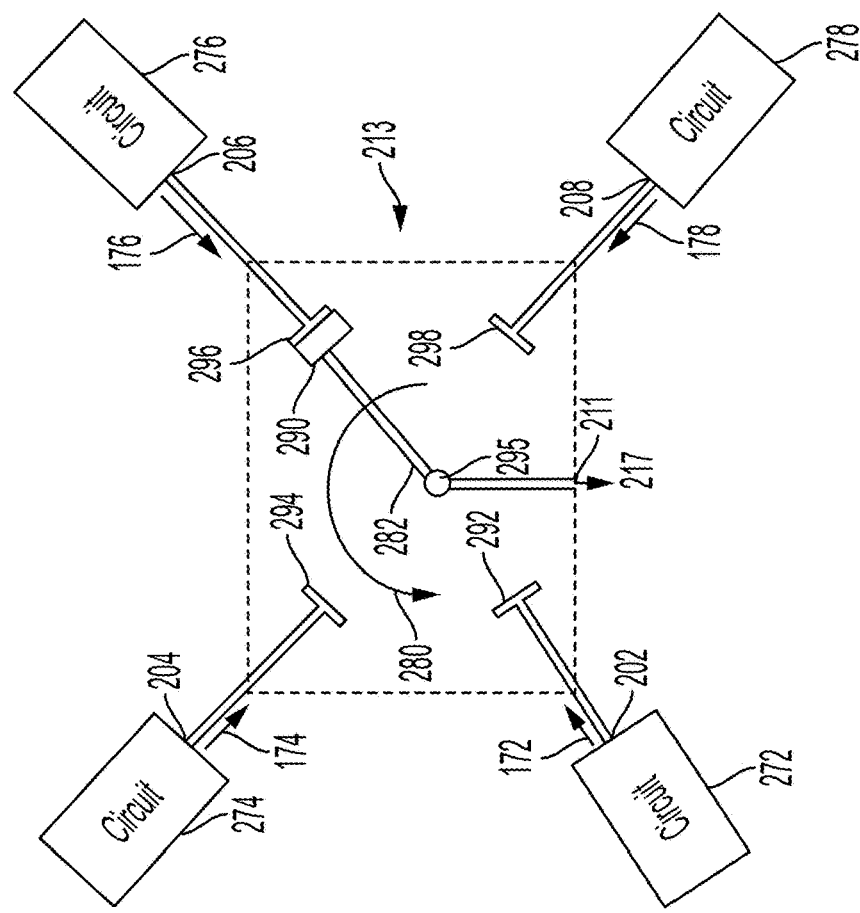
FIG. 2D
FIG. 2E
FIG. 2C

ULTRA-COMPACT AND MICROPOWER CIRCUIT TO MONITOR PROCESS, VOLTAGE, AND TEMPERATURE WITH HIGH ACCURACY

TECHNICAL FIELD

The present description relates generally to integrated circuits and, in particular, to integrated circuits having process, voltage, and temperature monitoring devices.

BACKGROUND

With the advancement of semiconductor manufacturing, voltage variations, temperature variations, and process variations, of semiconductor circuits become more profound and, consequently, monitoring voltage variations, monitoring temperature variations, and monitoring process variations in the semiconductor circuits developed on a wafer become especially important. Therefore, it is highly desirable to be able to do the monitoring more accurately.

BRIEF DESCRIPTION OF THE DRAWINGS

Certain features of the subject technology are set forth in the appended claims. However, for purposes of explanation, several aspects of the subject technology are depicted in the following figures.

FIGS. 2A, 2B, 2C, 2D, and 2E illustrate a schematic diagram of a PVT monitoring device, a circuit diagram of a portion of the PVT monitoring device, a conceptual view of a switch of the PVT monitoring device, a schematic diagram of an electronic switch of the PVT monitoring device, and an example of oscillation frequencies of the a ring oscillator, according to various aspects of the subject technology.

DETAILED DESCRIPTION

Figure 1:
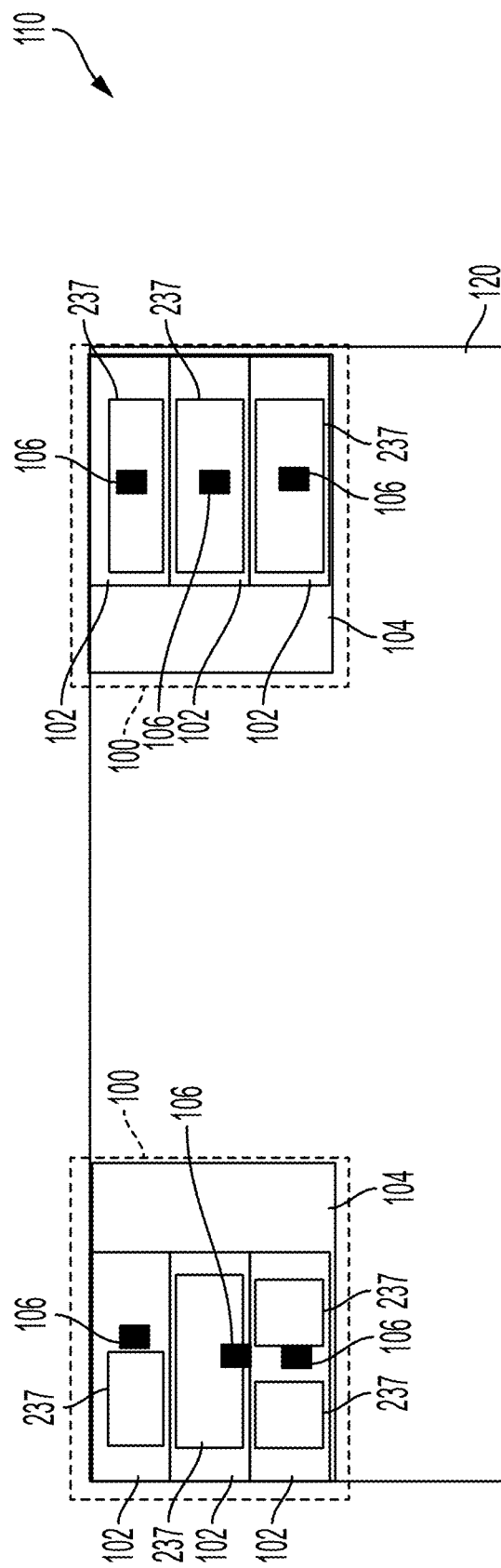
FIG. 1 illustrates a semiconductor die having multiple performance-critical regions with each performance-critical region having multiple process, voltage, and temperature (PVT) monitoring devices, according to various aspects of the subject technology.
Figure 1:
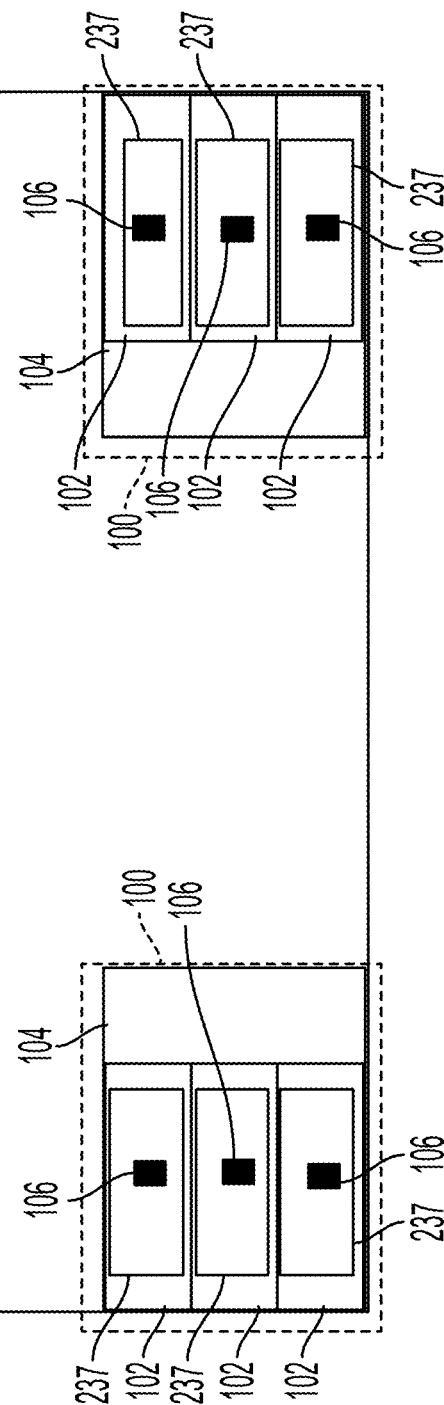

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

The semiconductor manufacturing industry is reaching pitch sizes of 5 nanometer or less and the semiconductor components on a die gets smaller and smaller and, thus, more and more semiconductor components may be fit on a die. It is desirable to accurately monitor voltages, temperatures, and process variations in a circuit component, in a die on a wafer, or in the whole wafer. In some embodiments, a voltage that is monitored is provided by an interconnect to a component on the semiconductor, e.g., a supply voltage applied to a drain of a transistor. High temperatures of the components of a die as well as voltage drops applied to the components of the die may cause performance issues that may reduce the speed of the affected components or the components may not produce the expected behavior.

In order to predict the behavior of the components in a die or in a wafer the voltage variations, the temperature variations, and the process variations are monitored. In some embodiments, the temperature variations in a die exceed 30 degrees Celsius and the voltage drop in a die may exceed 20 percent. Thus, to prevent/reduce the performance hit of the components, the voltage, temperature, and process monitoring devices are placed close or inside the performance-critical components, e.g., high speed samplers, wide band analog frontend circuits, and high resolution analog to digital converters (ADC). In some embodiments, to fit the voltage, temperature, and process monitoring devices, e.g., a process parameter monitoring devices, inside the components, the monitoring devices use complementary metal oxide semiconductor (CMOS) technology to reduce the size of the monitoring device. The CMOS technology uses both p-channel metal oxide semiconductor (PMOS) transistors and n-channel metal oxide semiconductor (NMOS) transistors. In some embodiments, in order to achieve the smaller size of the monitoring device, each monitoring device uses a single ring oscillator and then periodically, e.g., repeated at regularly occurring (potentially adjustable) intervals over a period of time, applies voltage signals and current signals proportional to voltage, temperature and process parameters of the die to the single ring oscillator. In some embodiments, one or more predetermined components of a die are components with a performance that is critical for the circuits on the die and may be referred to as performance-critical components of the die. In some embodiments, circuits that include the performance-critical components are performance-critical circuits. In some embodiments, the predetermined components have higher sensitivity to excess temperature or excess voltage drop such that if the component is outside a specific temperature range or the voltage of the component is outside a specific, e.g., predetermined, voltage range, the predetermined components may show inconsistent behavior that either does not perform as expected or does not work for the intended application.

FIG. 1 illustrates a semiconductor die 110 having multiple performance-critical regions with each performance-critical region having multiple voltage, temperature, and process (PVT) monitoring devices 106, according to various aspects of the subject technology. The semiconductor die 110 includes core regions 100. Each core region 100 includes one or more primary regions 102 (e.g., predetermined regions, performance-critical regions) and a control region 104. The core region 100 includes one or more circuits 237 that are inside the primary regions 102 and the control region 104 includes one or more logic circuits coupled to the primary regions 102 of each core region 100. In some embodiments, the primary regions 102 of the core region 100 consume more power than other areas 120 of the semiconductor die 110. Because of the generated temperature and voltage drop that is caused by the large power consumption of the primary regions 102, the voltage and temperature of the primary regions 102 are monitored. Thus, the primary regions 102 are regions that consume a large amount of power and, thus, may produce a large amount of heat and the temperature of the primary regions 102 may need monitoring. Also, the core regions 100 include one or more primary regions 102 and, similarly, the temperature of the core regions 100 may need monitoring. In some embodiments, the primary regions 102 include one or more circuits 237 that may show inconsistent behavior in the presence of excessive heat that causes temperature of the circuits 237 to go above a predefined range of operation. Thus, the circuit 237, the primary region 102, and the core region 100 are performance-critical circuits and regions.

In some embodiments, when the voltage of the performance-critical circuit is outside a specific voltage range, the performance-critical circuit does not function such that the performance-critical circuit either does not work at all and does not produce an output or produces an output that is not acceptable, e.g., a light detector produces a light intensity that is negative. In some embodiments, a high resolution ADC producing 24 bits or more or a high speed ADC with a sampling frequency of more than 100 MHz are performance-critical circuits. In some embodiments, the performance-critical circuit is a circuit that when the voltage is outside a voltage range, the temperature is outside a temperature range, or a process parameter is outside a parameter range the circuit does not function. In some embodiments, each performance-critical region includes one or more performance-critical circuits. In some embodiments, performance-critical circuits further include wideband analog frontend circuits and high speed sampler circuits. In some embodiments a semiconductor wafer is divided into a plurality of semiconductor dies 110. In some embodiments, each die 110 has a rectangle or square shape and include a specific circuit. In some embodiments, the circuit or circuits in the semiconductor die 110 are repeated in other dies. In some embodiments, the semiconductor wafer includes different circuits in different dies, e.g., half of the dies have a first circuit and the other half have a second circuit. In some embodiments, one, two, or more circuits are repeated in the dies. In some embodiments, the high speed circuits include circuits having an analog front end, e.g., the ADC or the sampler that samples an analog signal in time and provides digital values.

In some embodiments, PVT monitoring devices 106 that constantly monitor the voltage, the temperature, and the process are placed inside the primary region 102. In some embodiments, the core regions include circuits 237 that are inside the primary regions 102 and the circuits 237 are performance-critical and, thus, the primary region 102 is a performance-critical region. In some embodiments, the circuits 237 are high speed analog frontend circuits. Thus, one or more PVT monitoring devices 106 are placed inside the primary regions 102. The PVT monitoring device 106 is described with respect to FIGS. 2A and 2B. In some embodiments, the high power consumption in the primary regions 102 causes high temperatures above an acceptable temperature range of the circuits 237 and causes sub-optimal performance for the circuits 237. In some embodiments, the high power consumption of the circuits 237 cause considerable voltage drop such that the voltage applied to the circuit 237 drops below an acceptable supply voltage and again causes sub-optimal performance behavior for the circuits 237. In some embodiments, the temperature increase or the drop of the voltage (the supply voltage that reaches the circuit 237) may not cause sub-optimal performance behavior, but degrades the performance of the circuits and causes the circuits 237 to run slower, e.g., make slower switching. As shown, the PVT monitoring device 106 is coupled to the circuit 237 such that the PVT monitoring device 106 is inside a primary region 102 that includes the circuit 237.

Figure 2A:
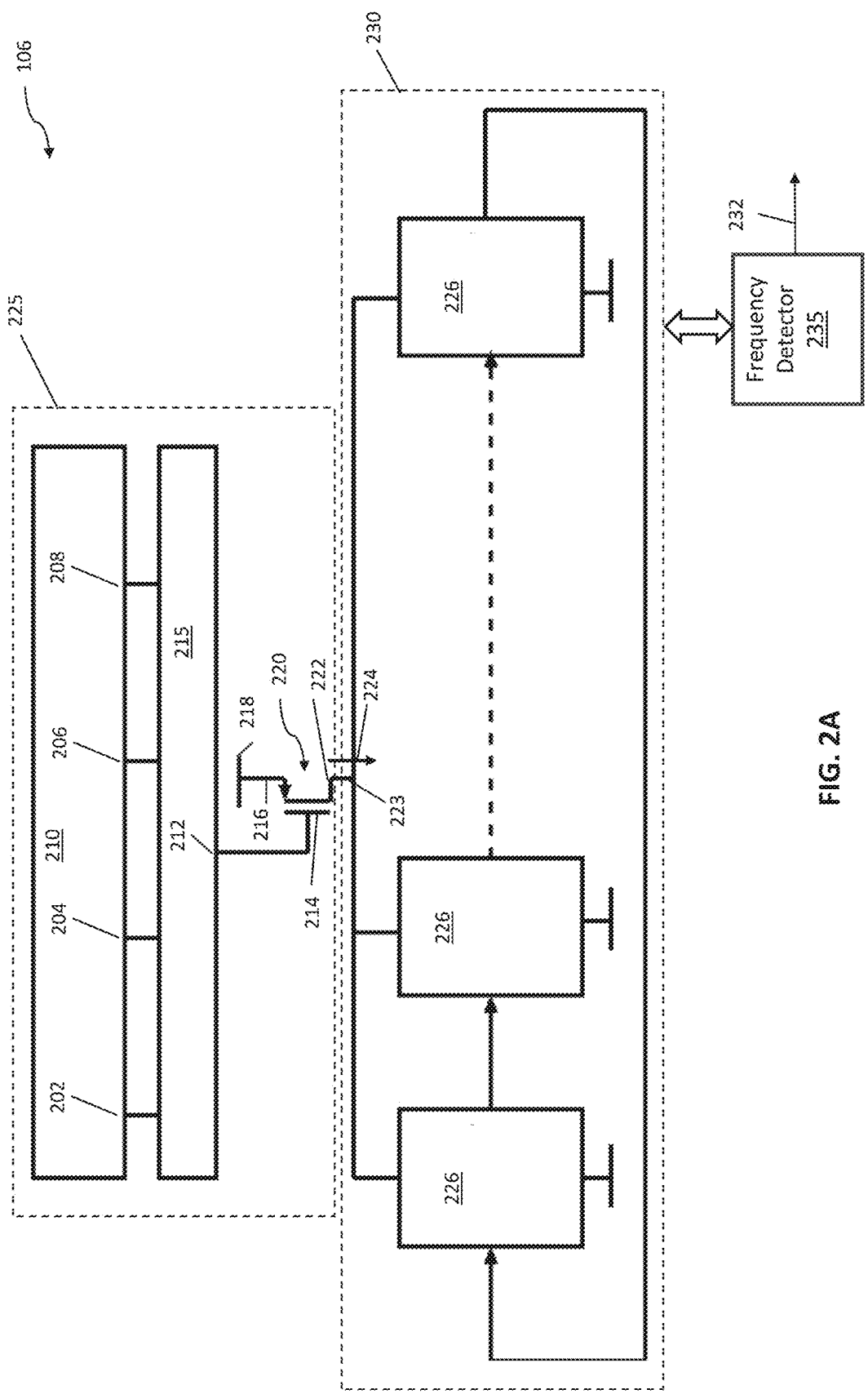

FIGS. 2A, 2B, 2C, 2D, and 2E illustrate a schematic diagram of a PVT monitoring device 106, and a circuit diagram of a portion of the PVT monitoring device 106, a conceptual view 213 of a switch of the PVT monitoring device 106, a schematic diagram of an electronic switch 209 of the PVT monitoring device 106, and an example of oscillation frequencies 232 of a ring oscillator 230, according to various aspects of the subject technology. FIG. 2A shows a current generating circuit 225 (e.g., a current generating module) that includes a first circuit 210 and a switch 215 (e.g., a time domain multiplexer). The first circuit 210 provides four signals representing the voltage, temperature, a first process parameter, and a second process parameter in the primary region 102. The first circuit 210 provides the four signals through output ports 202, 204, 206, and 208 to the switch 215, e.g., a selector. The switch 215 periodically selects one of the four signals and delivers the selected signal through an output port 212 of the switch 215 to a gate 214 of a transistor 220. A source 216 of the transistor 220 is connected to a ground 218. The transistor 220 provides a current 224 through a drain 222 to the ring oscillator 230, which in this exemplary embodiment (but not all possible embodiments) is a current starved ring oscillator that includes an input port 223. In some embodiments, the four signals, provided by the first circuit 210, include either four current signals, one voltage signal and three current signals, two voltage signals and two current signals, three voltage signals and three current signals, or four voltage signals.

The oscillation frequency of the ring oscillator 230 may be determined by an amount of current that enters the ring oscillator 230 through the input port 223 in some embodiments. Thus, in some embodiments, the current 224 represents one of the voltage, the temperature, the first process parameter, or the second process parameter that is selected by the switch 215 and enters the ring oscillator 230 through the input port 223. In some embodiments, the ring oscillator 230 oscillates at an oscillation frequencies 232 that is based on the current 224, e.g., an amount of the current 224. Thus, the oscillation frequency 232 of the ring oscillator 230 is based on the current 224 and at each instance of time, the oscillation frequency 232 of the ring oscillator 230 represents one of the voltage, the temperature, the first process parameter, or the second process parameter. In some embodiments, the output ports 206 and 208 respectively provide signals corresponding with the voltage and the temperature of the primary region 102. In some embodiments, the order of selecting the voltage, the temperature, the first process parameter, and the second process parameter by the switch 215 changes and the new order repeats. In some embodiments, the output ports 202 and 204 respectively provide signals corresponding with the process parameters of the primary region 102. In some embodiments, the voltage signals are used to generate currents that are proportional to the voltage signals and the currents are fed into the ring oscillator 230. In some embodiments, process parameters are parameters of the components, circuits, or devices on a semiconductor substrate that are affected and/or are controllable during the manufacturing process. Examples of process parameters that are controllable during manufacturing are conductivity type, carrier concentration, resistance, and carrier mobility. These parameters may be controlled during the manufacturing process and have impact on performance of the components and devices on the substrate. Thus, the process parameters of the components or devices may be measured to ensure correct performance of the components or devices.

As shown in FIG. 2A, the ring oscillator 230 includes delay units 226. In some embodiments, the first and second process parameters demonstrate average switching speeds of the PMOS and NMOS transistors. In some embodiments, the first process parameter represents an average switching speed of PMOS and NMOS transistors together and the second process parameter represents the difference between switching speeds of PMOS and NMOS transistors. In some embodiments, the first and second process parameters are selected to demonstrate the process corners that include slowest speed of PMOS transistors in a die, fastest speed of NMOS transistors in the die, a difference of average speeds of NMOS transistors and average speed of PMOS transistors, or a ratio of an average speed of NMOS transistors to an average speed of PMOS transistors. As shown in FIG. 2A, the ring oscillator 230 is coupled to a frequency detector 235 such that the frequency detector 235 senses the oscillation frequency 232 of the ring oscillator 230. In some embodiments, the frequency detector 235 includes a processor (not shown) and receives a signal from an input port of the frequency detector 235 and a frequency of the received signal, e.g., the oscillation frequency 232, is provided at an output of the frequency detector 235. In some embodiments, the received signal is a periodic signal and the frequency detector 235 measures the frequency, e.g., number of repetitions per second, of the received signal and provides the frequency of the signal at an output port of the frequency detector 235. In some embodiments, the frequency is measured by a frequency counter. In some embodiments, the PVT monitoring device 106 fits inside an area of less than 1000 square microns of the semiconductor die 110. In some embodiments, the oscillation frequency 232 of the ring oscillator 230 varies between 0.25 giga hertz (GHz) and 2.0 GHz.

Process variations that may occur during the fabrication of an integrated circuit may cause a deviation of a semiconductor component characteristic from the expected characteristics. In some embodiments, a first process parameter is an average speed, e.g., a switching speed, of NMOS transistors and a second process parameter is an average speed of PMOS transistors and a process corner is when a difference between the average speeds of NMOS transistors and PMOS transistors causes the semiconductor circuit to do not perform as expected. In some embodiments, a third process parameter is the difference between the average speeds of NMOS transistors and PMOS transistors. Thus, the third process parameter is capable of demonstrating the process corner. In some embodiments, the switching speed is a turn on switching speed and is defined as a time difference when a transistor output goes from ten percent to ninety percent of the turned on value.

Figure 2B:
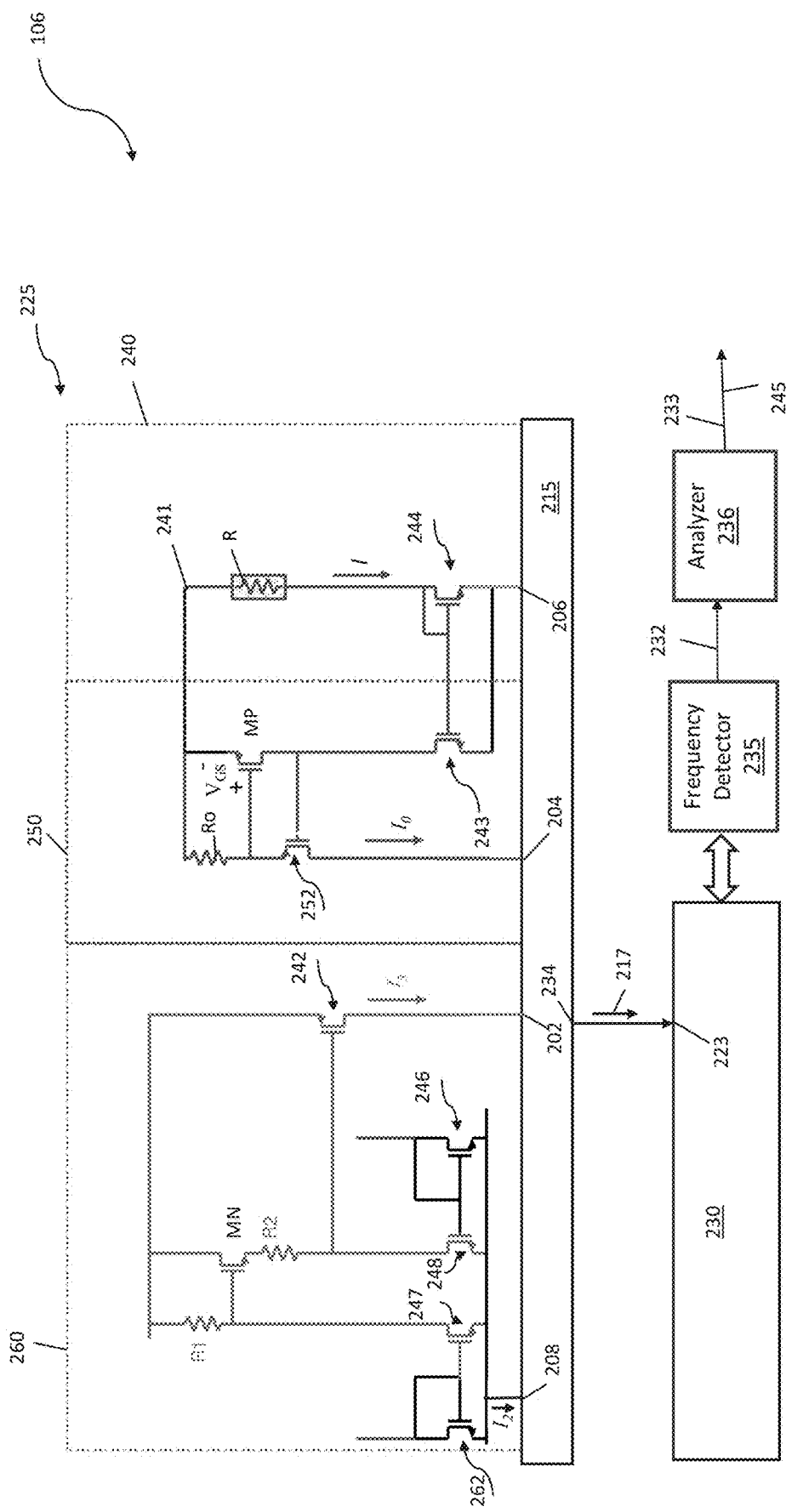

FIG. 2B is similar to FIG. 2A and shows the PVT monitoring device 106 that includes the ring oscillator 230 and the switch 215. FIG. 2B shows an analyzer 236. In some embodiments, the analyzer 236 includes a processor and a memory (not shown) for performing data analysis and data processing. As shown, the switch 215 receives currents I, $I_0$, $I_2$, and $I_3$ through output ports 206, 204, 208, and 202, respectively. The switch 215 periodically selects, repeatedly selects, one of the currents and sends the selected current through an output port 234 of the switch 215 to the ring oscillator 230. As noted, the frequency of the ring oscillator corresponds to, e.g., is proportional to or is based on, the selected current. The frequency detector 235 detects the frequency of the ring oscillator 230 and sends the oscillation frequency 232 to the analyzer 236. In some embodiments, the oscillation frequency 232 is not directly proportional to the voltage, the temperature, or one of the first or second process parameters but, rather, represents the voltage, the temperature, or one of the first or second process parameters. In some embodiments, although not proportional, however, there is a one-to-one relation between the oscillation frequency 232 and the voltage, the temperature, or one of the first or second process parameters and the relations are saved in one or more tables in the memory of the analyzer 236. In some embodiments, the analyzer 236 is calibrated to use the detected oscillation frequency 232 and provide a signal 233 that is one of the voltage, the temperature, or one of the first or second process parameters in a region, e.g., a point in the region, of the semiconductor die 110 that includes the PVT monitoring device 106. In some embodiments, the analyzer 236 is a data analyzer that receives the detected frequency of the ring oscillator from the frequency detector 235. As noted, the analyzer 236 may have one or more tables in the memory of the analyzer 236 that includes the relations between the detected frequency and one or more of the voltage, temperature, or process parameters. The analyzer 236 may retrieve the tables and determine one or voltage, temperature, or process parameters based on the detected frequency and using the tables. Since the tables may not include all the frequency range and the table may not have the detected frequency, the processor of the analyzer 236 may interpolate between given data points of a table or extrapolate beyond a given data point of the table and use the interpolation or extrapolation to determine and provide the voltage, temperature, or process parameter. In some embodiments, the analyzer 236 uses the voltage, temperature, or process parameter and generates a two-dimensional (2D) or a three-dimensional (3D) map of the oscillation frequency 232 versus the voltage, the temperature, or the process parameter for a point in a region of the semiconductor die 110 or a semiconductor substrate. In some embodiments, the analyzer 236, e.g., the processor of the analyzer 236, performs the inverse map by dividing the map into small regions, finding a linear approximation of the map in each small region (e.g., performing piecewise linear approximation), and finding an inverse of the piecewise linear approximated map. Thus, in some embodiments, the analyzer 236 receives the detected oscillation frequency 232 of the ring oscillator 230 from the frequency detector 235 and provides the voltage, temperature, or process parameter, which is the signal 233, based on the received oscillation frequency 232.

In some embodiments, oscillation frequencies 232 are determined, e.g., calculated, that correspond to two or more voltages and two or more temperatures in a same region, e.g., at a same point of the same region, of a semiconductor die 110. A map of the oscillation frequency 232 variations versus the voltage and temperature variations is generated based on the above determined oscillation frequencies 232. In some embodiments, the map is generated by the analyzer 236 that generates a map 245 of the oscillation frequency 232 vs. the voltage and/or the temperature. In some embodiments, the map 245 is used for calibrating the PVT monitoring device 106. Therefore, in some embodiments, an inverse of the map 245 is generated using a pseudo inverse method. Generating the inverse of the map 245 may be performed by the analyzer 236. The analyzer 236 may use the inverse of the map 245 to calibrate the PVT monitoring device and present the voltage or the temperature variations vs. the oscillation frequency 232. In some embodiments, the voltage and temperature variations provided by the analyzer 236 are accurate to 1 millivolts and 0.5 degrees Celsius, respectively. In some embodiments, the signal 233 includes one or more of the voltage, the temperature, or the first or second process parameter in the region of the semiconductor die 110. The calibration of the analyzer 236 is described with respect to FIGS. 7A, 7B, 7C, and 8. In some embodiments, two regions of the semiconductor substrate are adjacent to each other if they are in the same die or if a closest distance between edges of the two regions is less than 10 microns. In some embodiments, the analyzer 236 is implemented as a software application on the processor of the frequency detector 235. Thus, in some embodiments, the analyzer 236 generates the map 245 of oscillation frequency 232 versus the voltage variations, the temperature variations, or process parameter variations. In some embodiments, the analyzer 236 generates an inverse map of the voltage, the temperature, or the process parameter versus the oscillation frequency 232.

FIG. 2B shows the current generating circuit 225. In the current generating circuit 225, in a sub-circuit 240, the resistor R is a calibrated resistor that its resistance and the variation of the resistance with temperature is known. In some embodiments, because a resistance of the resistor R depends on temperature, a current I that goes through the resistor R and the transistor 244, depends on the voltage at node 241 and also depends on temperature. In some embodiments, the temperature is determined and based on the temperature, a modified resistance of the resistor R at that temperature is determined, e.g., calculated. Thus, the voltage at node 241 may be determined by current I of the modified resistance of the resistor R. In some embodiments, the current I, strongly depends on the voltage and weakly depends on temperature. In the current generating circuit 225, a sub-circuit 250, provides a current $I_0$ proportional, e.g., having a one-to-one increasing relation, to the gate-source voltage ($V_{GS}$) of the PMOS transistor MP over a resistance of the resistor $R_0$ when the PMOS transistor MP, the PMOS transistor 252, and the NMOS transistor 243 are turned on and are conducting current. In some embodiments, because $V_{GS}$ of the PMOS transistor MP depends on temperature, then the current $I_0$ of the resistor $R_0$ that goes through the PMOS transistor 252 depends on the temperature. In some embodiments, the current $I_0$ depends on temperature. Thus, in some embodiments, an amount of the current $I_0$ is an indication of the temperature in a region that includes the PMOS transistor MP. The current generating circuit 225 also includes a sub-circuit 260. A current $I_3$ of the PMOS transistor 242 over a current $I_1$ of NMOS transistor 246 may present a process corner. In some embodiments, the sub-circuits 240, 250, and 260 are included in a single circuit, e.g., the current generating circuit 225. In some embodiments, the sub-circuits 240, 250, and 260 provide the currents I, $I_0$, $I_2$, and $I_3$ that are fed into four separate ring oscillators 230 to be converted into oscillation frequencies. In some embodiments, the sub-circuits 240, 250, and 260 provide the currents I, $I_0$, $I_2$, and $I_3$ are multiplexed and are fed into a single ring oscillator 230 to be converted into oscillation frequencies. In some embodiments, the current I, depends on the voltage at node 241, e.g., a voltage a voltage interconnect line, and the current $I_0$ depends on the $V_{GS}$ voltage of the PMOS transistor MP. In some embodiments, the switch 215 selects one of the currents I, $I_0$, $I_2$, and $I_3$ and sends one of the currents I, $I_0$, $I_2$, and $I_3$, one after the other and repeatedly, e.g., periodically, as a selected signal 217, e.g., a current, to the ring oscillator 230. In some embodiments, the current $I_0$ is used for monitoring the temperature. In some embodiments, the current $I_2$ is generated by NMOS transistors 246, 247, 248, 262, and MN of the sub-circuit 260. In some embodiments, the current $I_2$ is generated by a circuit similar to the sub-circuits 240 and, thus, the current $I_2$ is associated with, e.g., proportional to, a voltage of a voltage interconnect line at another location of the semiconductor die 110 that is different from the location that I is measured.

FIG. 2C illustrates a conceptual view 213 of the switch 215 (e.g., the multiplexer) that conceptually shows how the sampling of the output ports 202, 204, 206, and 208 are performed. In some embodiments, the selection is performed by an arm 282 that is connected, from a first end to a center 295. In some embodiments, the arm 282 rotates around the center 295. As shown, the center 295 and the arm 282 are electrically connected to either the output port 234 of FIG. 2B or the output port 212 of FIG. 2A. As the arm 282 moves in a direction 280, the other end of the arm 282 that includes an electrical contact 290 periodically connects, e.g., repeatedly couples, to the electrical contacts 292, 294, 296, and 298 that are connected to the output ports 202, 204, 206, and 208, respectively. Thus, in some embodiments, respective electrical signals, e.g., currents, of the output ports 202, 204, 206, and 208 are periodically sampled by the arm 282 and the sampled current is transferred to an output port 211, which is consistent with the output port 234 of FIG. 2B. In some embodiments, the respective electrical signals, e.g., voltages or currents, of the output ports 202, 204, 206, and 208 are periodically sampled and are transferred to the output port 211, which is consistent with the output port 212 of FIG. 2A. In some embodiments and in a conceptual view, FIG. 2C shows that the electrical contacts 292, 294, 296, and 298 of the output ports 202, 204, 206, and 208 are uniformly distributed around a circle with the center 295 such that the arm 282 spins uniformly and continuously in the direction 280 around the center 295.

FIG. 2D illustrates a switch 209 (e.g., a time domain multiplexer or an electronic switch) that is consistent with FIG. 2C and the selection is made by an electronic selector 256. In some embodiments, the switching between output ports 202, 204, 206, and 208 is electrically performed and switching between the electrical contacts 292, 294, 296, and 298 is performed by the electronic selector 256. Therefore, the electronic selector 256 electrically connects and samples each one of the output ports 202, 204, 206, and 208 with equal amount of time, which is between about 100 microseconds and 500 microseconds. As used herein, an "equal amount of time" does not require the exact same amount of time, but allows for deviations due to, for instance, margins of error, tolerances, interference, non-linearities, and other realities of engineering and manufacturing. As shown, the output ports 202, 204, 206, and 208 are electrically connected to circuits 272, 274, 276, and 278, respectively. In some embodiments, the circuits 272, 274, 276, and 278 generate signals, e.g., currents or voltages, which are associated with, e.g., based on or proportional to, the voltage, the temperature, and/or one, two, or more process parameters associated with a region, e.g., a point in the region, of a substrate as above. In some embodiments, the circuit 272 is similar to the sub-circuit 240 for determining the voltage variations, the circuit 274 is similar to the sub-circuit 250 for determining the temperature variations, and the circuits 276 and 278 are consistent with the sub-circuit 260 for determining the process variations. In some embodiments, the PVT monitoring devices 106 is placed in proximity, e.g., is arranged in proximity, to high-speed, performance-critical circuits. In some embodiments, the high-speed circuit has a switching frequency between 10 GHz and 50 GHz. In some embodiments, electric signals 172, 174, 176, and 178 at output ports 202, 204, 206, and 208 of the circuits 272, 274, 276, and 278 are transferred to the switch 215 to be periodically sampled by the switch 215 and to generate a periodically selected signal 217, e.g., a current, at an output port 211 of the switch 215. In some embodiments, placing the PVT monitoring devices 106 in proximity of the circuit 237 is defined as having a distance of less than 100 microns between boundaries of the PVT monitoring devices 106 and the circuit 237. In some embodiments, the periodically selected signal 217 is a current consistent with the current 224 of FIG. 2A that periodically represents one of the voltage, the temperature, the first process parameter, or the second process parameter that is selected by the switch 215.

The electronic selector 256 includes at least four inputs that are connected to the output ports 202, 204, 206, and 208. The electronic selector 256 switches between the output ports 202, 204, 206, and 208 and at each instance of time provides the periodically selected signal 217, which is one of the signals, e.g., a voltage or current, of one of the output ports 202, 204, 206, or 208 that are repeatedly sampled and provided one by one at an output port 211 of the electronic selector 256 that is consistent with the output port 212 of FIG. 2A or the output port 234 of FIG. 2B. In some embodiments, the sampling time of the output ports 202, 204, 206, and 208 are between 20 microseconds and 100 microseconds. In some embodiments, the signals at the output ports 202, 204, 206, or 208 are voltages. In some embodiments, because the input to the ring oscillator 230 is a current and the oscillation frequency of the ring oscillator 230 is based on the input current, the voltages at the output ports 202, 204, 206, or 208 are converted into currents before being fed into the ring oscillator 230.

FIG. 2E shows an example of the oscillation frequencies 232 of the ring oscillator 230 that are generated at an output port of the frequency detector 235 when the periodically selected signal 217 is fed into the ring oscillator 230. As shown in FIGS. 2C and 2D, the electric signals 172, 174, 176, and 178, e.g., electrical currents, are periodically selected one by one, e.g., one at a time, and is fed into the ring oscillator 230. Thus, the oscillation frequencies 232 of the ring oscillator 230 is based on the selected electrical signal. In some embodiments, when the electrical signals 172, 174, 176, and 178 is fed into the ring oscillator 230, the oscillation frequencies 171, 173, 175, and 177 are respectively produced. FIG. 2E shows the oscillation frequencies 171, 173, 175, and 177 that are based on the electrical signals 172, 174, 176, or 178 from output ports 202, 204, 206, or 208 of circuits 272, 274, 276, and 278 that are periodically fed into the ring oscillator 230. The electrical signals 172, 174, 176, or 178 are separated by T seconds, e.g., at T seconds, at 2T seconds, at 3T seconds, at 4T seconds, at 5T seconds, at 6T seconds, at 7T seconds, and at 8T seconds, etc. Thus, the output port 202, 204, 206, or 208 of each circuit 272, 274, 276, and 278 is sampled in the above order repeatedly, e.g., periodically, every 4T seconds and the oscillation frequencies 171, 173, 175, and 177 are repeatedly produced every 4T seconds. Thus, in some embodiments, the ring oscillator 230 receives a current associated with, e.g., proportional to, the electric signals 172, 174, 176, and 176 that repeats every 4T seconds, where T is between 50 microseconds and 200 microseconds. Thus, the electric signals 172, 174, 176, and 178 from the circuits 272, 274, 276, and 278 are periodically selected to be supplied to the ring oscillator 230 (with period 4T) and the ring oscillator periodically generates the oscillation frequencies 171, 173, 175, and 177 that are detected at the output of the frequency detector 235. In some embodiments, the oscillation frequencies 171, 173, 175, and 177 of FIG. 2E that periodically change are the oscillation frequency 232 of the ring oscillator 230 when the periodically selected signal 217 which is a current is fed into the ring oscillator 230. The ring oscillator 230 may generate an oscillation frequency 232 that corresponds with the selected signal 217. Thus, FIG. 2E shows the oscillation frequencies 232 that corresponds with the voltage, the temperature, the first process parameter, and the second process parameter. Also, because the selected signal 217 periodically changes the oscillation frequencies 232 of FIG. 2E periodically repeats with the same period as the period of the selected signal 217.

Figure 3:
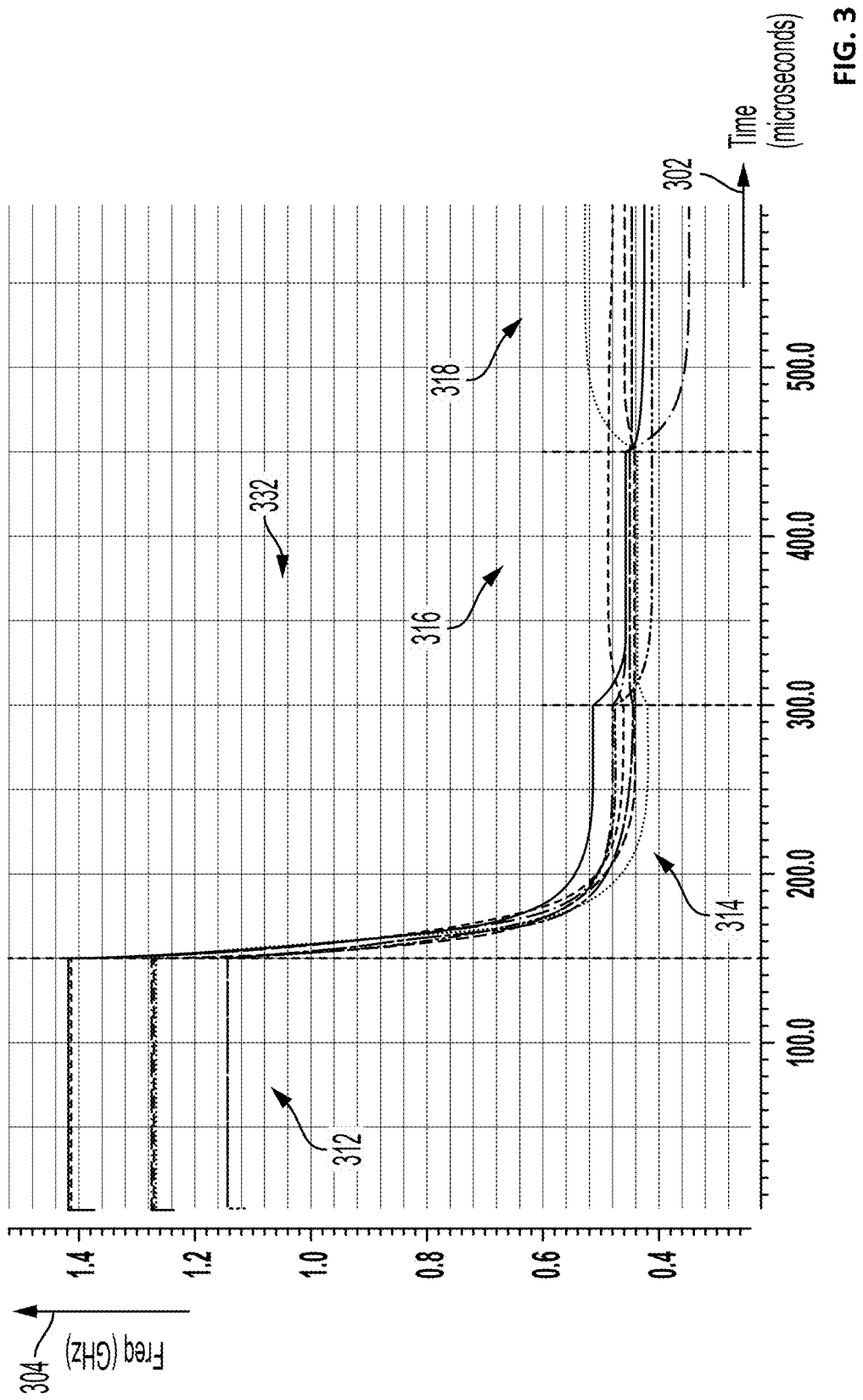
FIG. 3 illustrates multiple graphs of an oscillation frequency of a ring oscillator of a PVT monitoring device, according to various aspects of the subject technology.

FIG. 3 illustrates multiple graphs of an oscillation frequency of the ring oscillator 230 of a PVT monitoring device, according to various aspects of the subject technology. FIG. 3 shows the graphs 332 that show the oscillation frequency 232 of the ring oscillator 230 on a frequency coordinate 304 and a time coordinate 302. As shown, the switch 215 selects one of the currents of the current generating circuit 225 every 150 microseconds. A section 312 between zero and 150 microseconds shows the frequency of the ring oscillator 230 for a first process parameter. In some embodiments, the first process parameter is the average of the speed of the NMOS and PMOS transistors such that NMOS and the PMOS transistors compensate each other and provide the largest current of the current generating circuit 225 and, thus, generates the largest oscillation frequency 232 at the section 312. In some embodiments, the oscillation frequency at the section 312 is measured by feeding a current of the current generating circuit 225 corresponding to the first process parameter and measuring the oscillation frequency 232 of the ring oscillator 230. A section 314, between 150 microseconds and 300 microseconds, shows the frequency of the ring oscillator 230 for the temperature parameter. A section 316, between 300 microseconds and 450 microseconds, shows the frequency of the ring oscillator 230 for the voltage parameter. A section 318 between 450 microseconds and 600 microseconds shows the frequency of the ring oscillator 230 for a second process parameter that shows the difference between average switching speeds of PMOS and NMOS transistors, which is the difference between average switching speeds of p-channel and n-channel transistors. In some embodiments, each graph of FIG. 3 is measured on a same location on different wafers that a same circuit is produced and different lines of the graphs 332 is produced.

Figure 4:
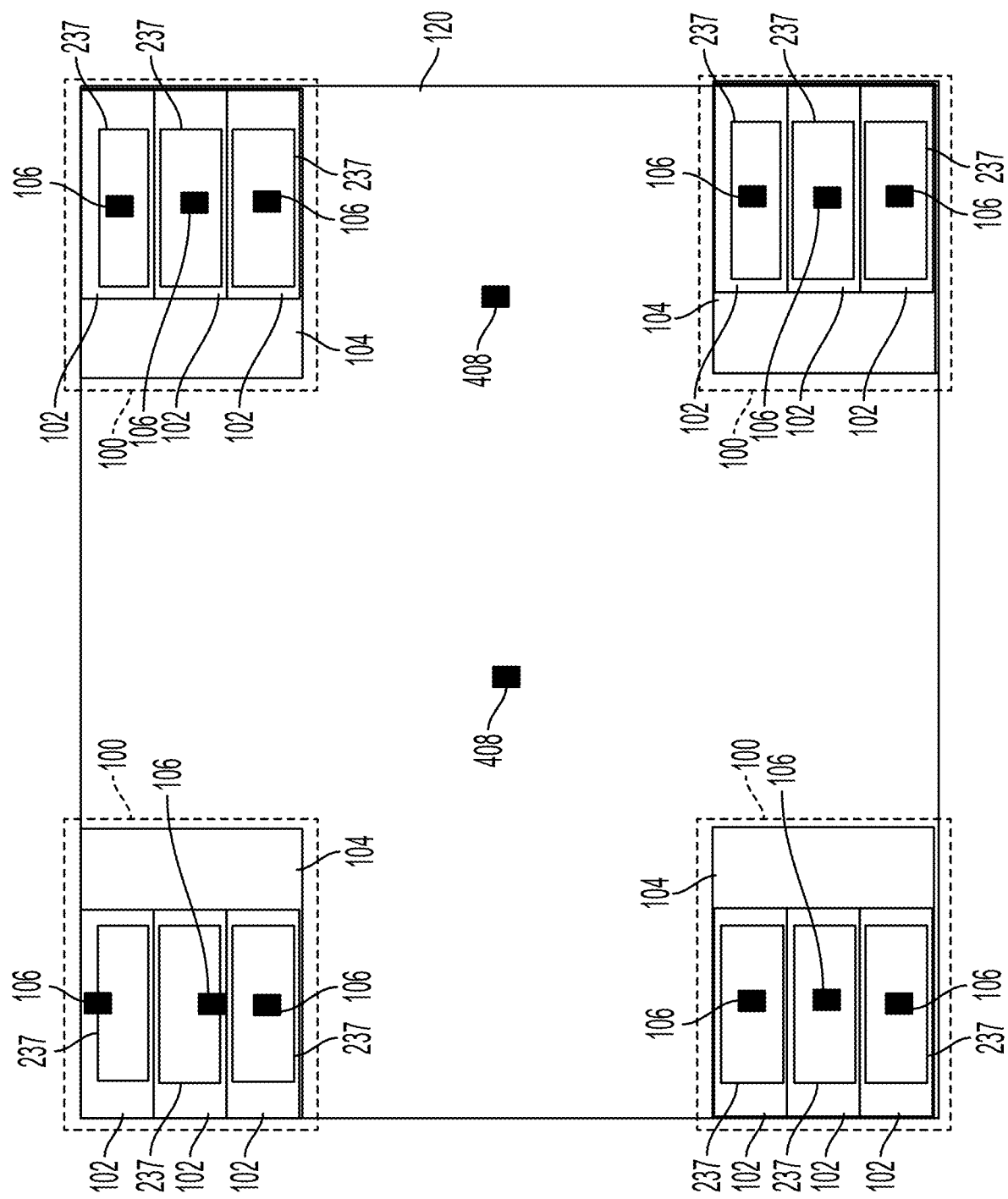
FIG. 4 illustrates a semiconductor die having multiple performance-critical regions with each performance-critical region having multiple PVT monitoring devices, according to various aspects of the subject technology.

FIG. 4 illustrates a semiconductor die having multiple performance-critical regions with each performance-critical region having multiple PVT monitoring devices, according to various aspects of the subject technology. FIG. 4 is consistent with FIG. 1 but has one or more PVT monitoring devices 408 in the area 120. The PVT monitoring devices 408 that have a width and length much larger, e.g., ten time or more, than a width and length of the PVT monitoring devices 106, are described with respect to FIG. 5.

Figure 5:
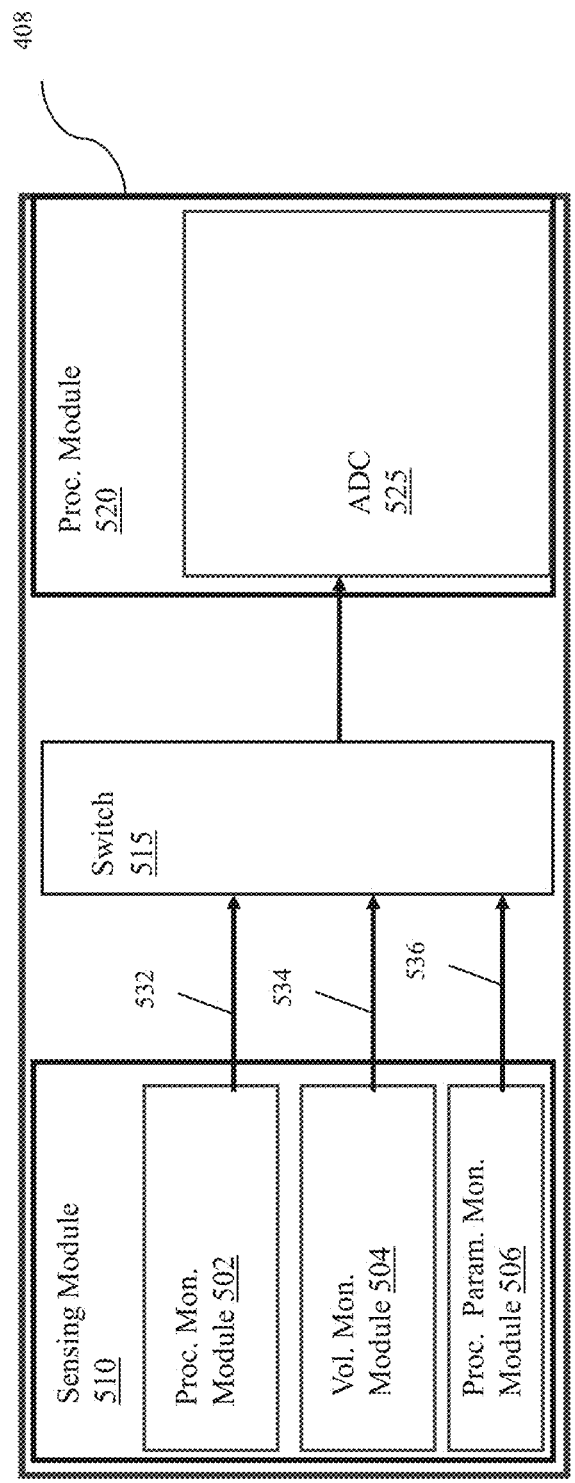
FIG. 5 illustrates a schematic diagram of a PVT monitoring device.

FIG. 5 illustrates a schematic diagram of a PVT monitoring device. FIG. 5 shows the PVT monitoring device 408 that includes a sensing module 510. The sensing module 510 includes a process monitoring module 502, a voltage monitoring module 504, and a process parameter monitoring module 506. The process monitoring module 502 generates a parameter 532, the voltage monitoring module 504 generates a parameter 534, and the process parameter monitoring module 506 generates the parameter 536. The parameters 532, 534, and 536 are proportional, e.g., demonstrate an increasing relation, to one of the parameters that are monitored. The switch 515, e.g., the selector, periodically selects one of the parameters 532, 534, and 536. The PVT monitoring device 408 also includes a processing module 520 that includes an ADC 525. In some embodiments, the ADC 525 has high precision and, thus, may occupy a large area on the semiconductor die 110. In some embodiments, first and second parameters are proportional when the first and second parameters have a one-to-one increasing relation such that when the first parameter increases the second parameter also increases and when the first parameter decreases the second parameter also decreases.

Figure 6:
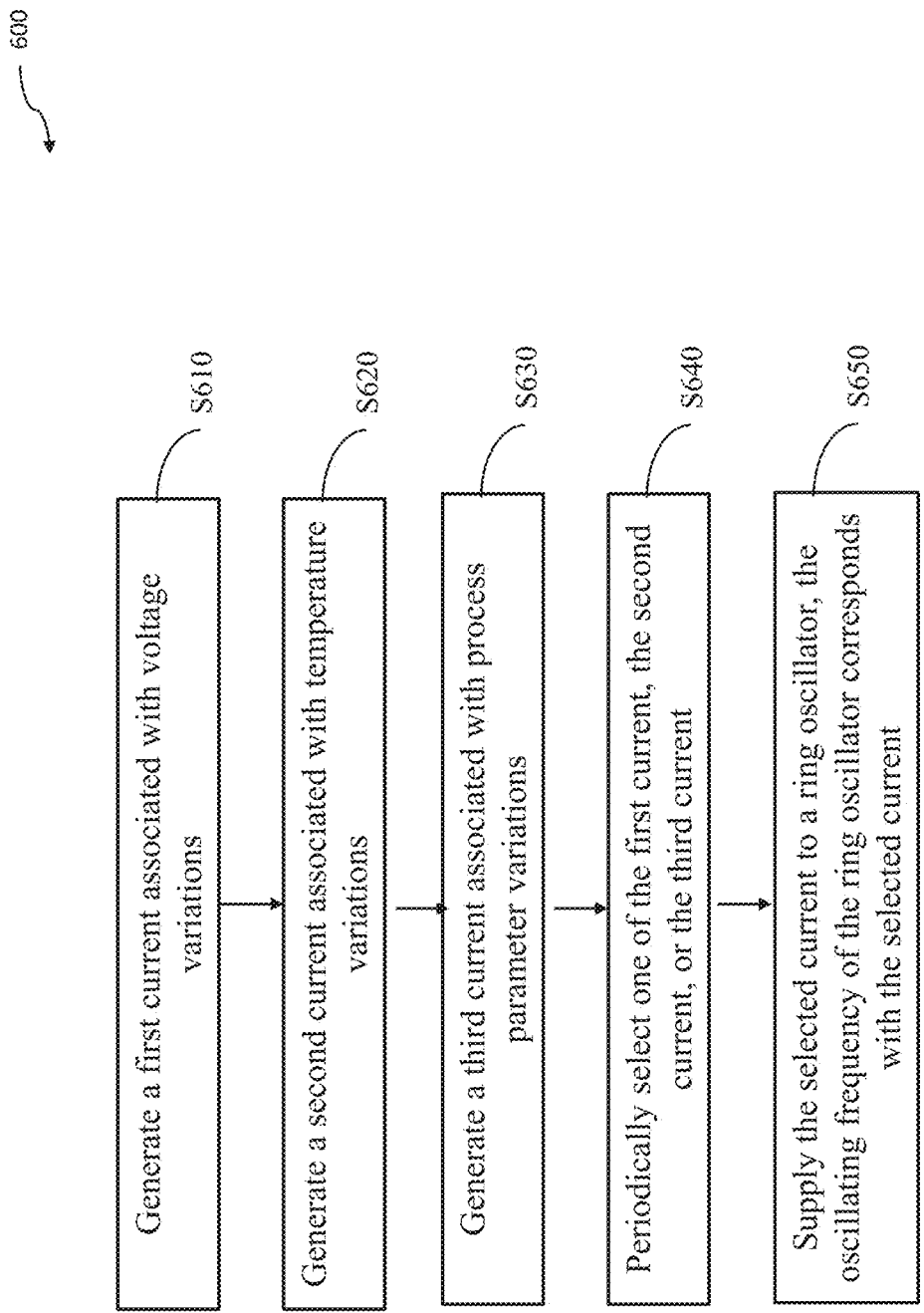
FIG. 6 illustrates a flow diagram of a method for operating a device, according to various aspects of the subject technology.

FIG. 6 illustrates a block diagram 600 of method for operating a device, according to various aspects of the subject technology. The block diagram 600 may be used for performing PVT monitoring of a region of a semiconductor substrate by a PVT monitoring device that is implemented in the die. For example, the method may be used for PVT monitoring at a predetermined region (e.g., the primary region 102) of the semiconductor die 110 of FIGS. 1 and 4. At step S610, a first current associated with voltage variations is generated by the PVT monitoring device 106 of FIG. 2A. At step S620, a second current associated with temperature variations is generated by the PVT monitoring device 106 of FIG. 2A. At step S630, a third current associated with process parameter variations is generated by the PVT monitoring device 106 of FIG. 2A. At step S640, one of the first current, the second current, or the third current is selected one by one and periodically e.g., selected one after the other and repeating the selection. At step S650, the selected current is supplied to a ring oscillator and the ring oscillator is configured, e.g., created, such that the oscillation frequency of the ring oscillator corresponds with the selected current. Thus, at each instance of time, the oscillation frequency of the ring oscillator corresponds with one of the voltage, temperature, or the process parameter at the predetermined region of the semiconductor die 110. In some embodiments, a semiconductor substrate is a piece of a wafer and is either a silicon substrate, a germanium substrate, a gallium-arsenide substrate, etc. Thus, the semiconductor substrate is a piece of a silicon wafer, a piece of germanium wafer, a piece of gallium-arsenide wafer, etc.

Figure 7C:
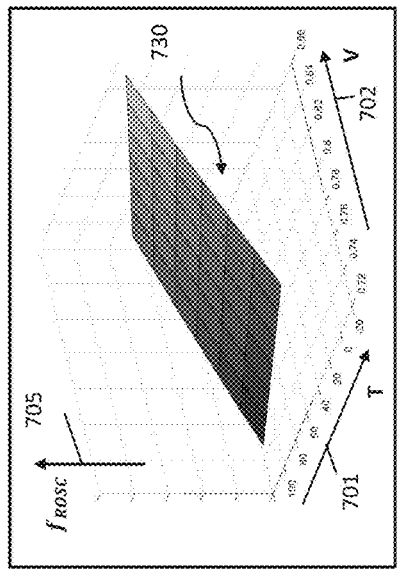
FIGS. 7A, 7B and 7C illustrate 3-dimensional graphs of the oscillation frequency of the ring oscillator with respect to voltage and temperature variations for three modes of operation of the PVT monitoring device 106, according to various aspects of the subject technology.
Figure 7B:
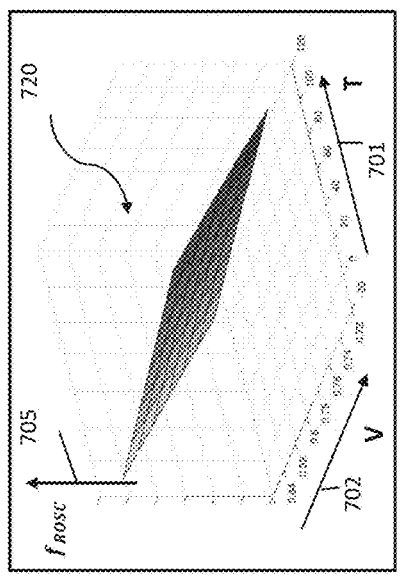
Figure 7A:
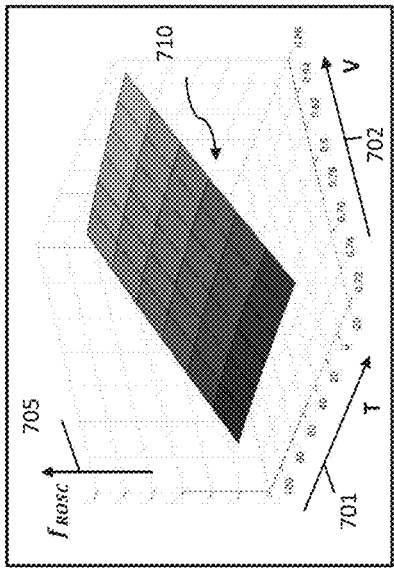

FIGS. 7A, 7B, and 7C illustrate 3D graphs 710, 720, and 730 of the oscillation frequency of the ring oscillator 230 with respect to voltage and temperature variations for three modes of operation of the PVT monitoring device 106, according to various aspects of the subject technology. FIGS. 7A, 7B and 7C show the oscillation frequency on a coordinate 705 versus variations of temperature T, on a coordinate 701, and variations of voltage V, on a coordinate 702. In some embodiments, the 3D graphs 710, 720, and 730 are measured graphs. The 3D graphs may be approximated by linear or piecewise linear curves. For a first mode of operation associated with FIG. 7A, the 3D graph 710 corresponds to when the ring oscillator 230 receives the selected signal 217, which is a current, from a first electronic circuit similar to the sub-circuit 240 that is used for determining the voltage variations and provides a current I that strongly depends on V and weakly depends on T. For a second mode of operation associated with FIG. 7B, the 3D graph 720 corresponds to when the ring oscillator 230 receives the selected signal 217, which is a current, from a second electronic circuit similar to the sub-circuit 250 that is used for determining the temperature variations which provides a current $I_0$ that strongly depends on T and weakly depends on V. For a third mode of operation associated with FIG. 7C, the 3D graph 730 corresponds to when the ring oscillator 230 receives the selected signal 217, which is a current, from a third electronic circuit similar to the sub-circuit 260 that is used for determining the process variations and provides the current $I_2$, or $I_3$ that moderately depends on both V and T. In some embodiments the 3D graphs 710, 720, and 730 are simulated. In some embodiments, using the above methods and devices, the temperature gradients across the serializer-deserializer (Serdes) data lanes are calculated, which is used to detect hot spots on the chips with 0.5° C. accuracy.

Figure 8:
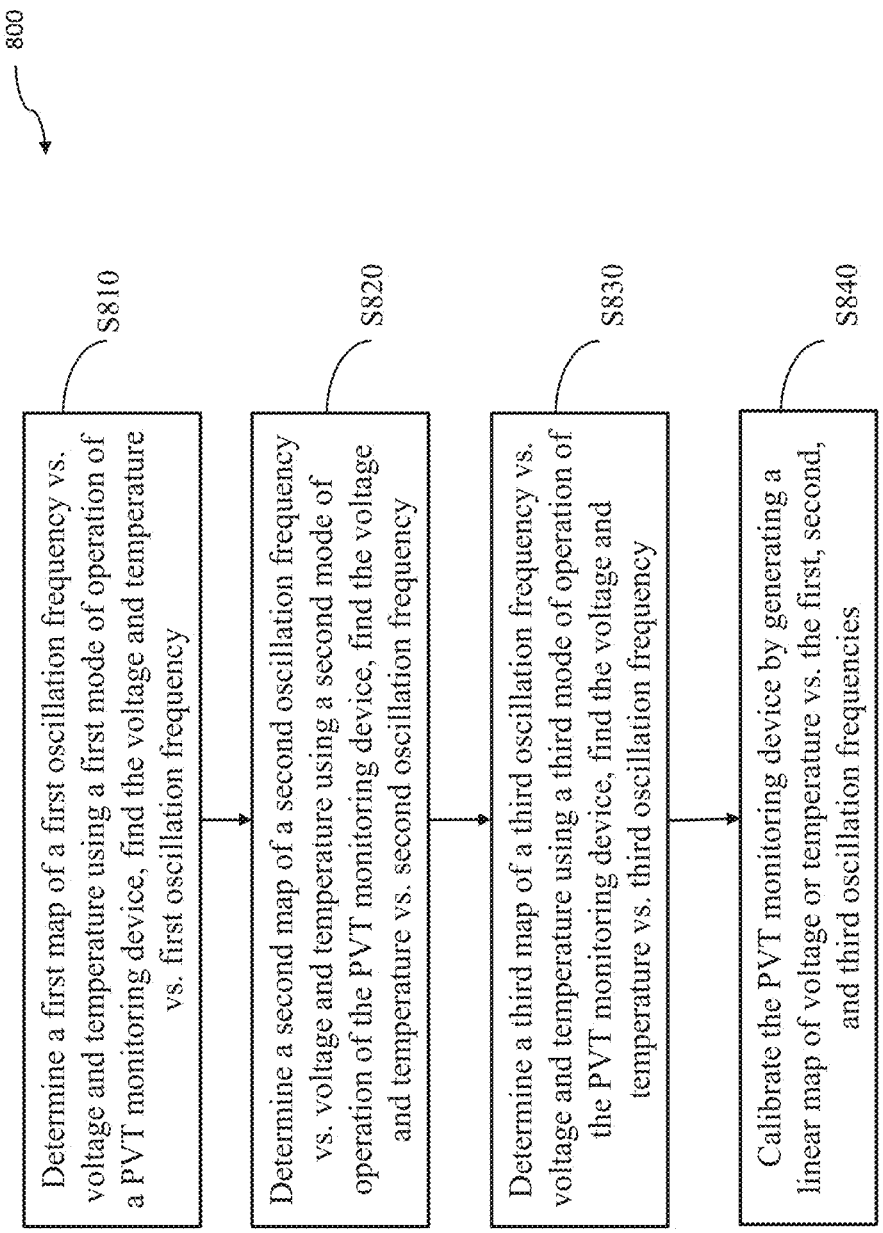
FIG. 8 illustrates a flow diagram of a method for calibrating a PVT monitoring device, according to various aspects of the subject technology.

FIG. 8 illustrates a flow diagram 800 of a method for calibrating a PVT monitoring device, according to various aspects of the subject technology. The flow diagram 800 may be used for calibrating the PVT monitoring device 106. At step S810, a first map of a first oscillation frequency vs. voltage and temperature, is generated using the first electronic circuit for the first mode of operation of the PVT monitoring device 106. A first inverse map is determined by the analyzer 236 to find the voltage and temperature vs. first oscillation frequency. In some embodiments, the first oscillation frequency strongly depends on the voltage and weakly depends on temperature. In some embodiments, the first map is approximated to a first linear map before the first inverse map is determined. The first linear map is then inversed to produce the first inverse map. At step S820, a second map of a second oscillation frequency vs. voltage and temperature, is generated using the second electronic circuit for the second mode of operation of the PVT monitoring device 106. A second inverse map is determined to find the voltage and temperature vs. first oscillation frequency. In some embodiments, the second process strongly depends on the temperature and weakly depends on the voltage and the second map is approximated to a linear map before the second inverse map is determined. At step S830, a third map of a third oscillation frequency vs. voltage and temperature, is generated using the third electronic circuit for the third mode of operation of the PVT monitoring device 106. A third inverse map is determined to find the voltage and temperature vs. third oscillation frequency. In some embodiments, the third process similarly depends on both the voltage and on the temperature and the third map is approximated to a linear map before the third inverse map is determined. In some embodiments, the first map, the second map, and the third map are measured and the first inverse map, the second inverse map, and the third inverse map are calculated by the analyzer 236 based on the first map, the second map, and the third map. In some embodiments, the first map, the second map, and the third map are determined, e.g., calculated or simulated, by the analyzer 236 for a point on the substrate based on a layout of the circuits and process information used for generating the circuits.

At step S840, a PVT monitoring device is calibrated and a linear equation is generated for each one of the voltage or the temperature vs. the first, second, and third oscillation frequencies. In some embodiments, equations (1) and (2) for the voltage or temperature are shown below. In the equations (1) and (2), $f_1$, $f_2$, and $f_3$ are the first, second and third oscillation frequencies for the first, second, and third modes of operation. In some embodiments, during a calibration process and implementing the flow diagram 800, the coefficients $a_{11}$, $a_{12}$, $a_{13}$, $a_{21}$, $a_{22}$, $a_{23}$, $a_{10}$, and $a_{20}$ are determined using inverse mapping as described below. In some embodiments, one or two of the coefficients in the equations (1) and (2) are zero or negligible such that one or two terms in the equations (1) and (2) are negligible, e.g., comparable with noise and, thus, the equations (1) and (2) depend only on one or two of the oscillation frequencies $f_1$, $f_2$, or $f_3$. In some embodiments:

$$T = a_{11}f_1 + a_{12}f_2 + a_{13}f_3 + a_{10} \quad \text{Equation (1)}$$

$$V = a_{21}f_1 + a_{22}f_2 + a_{23}f_3 + a_{20} \quad \text{Equation (2)}$$

In some embodiments, the first, the second, and the third map are calculated by the analyzer 236 and the maps are linearized and inverse maps are determined by the analyzer 236. The inverse maps are the voltage and temperature described as linear equations of one of the oscillation frequencies, e.g., the oscillation frequency of the first, second, or third process. In some embodiments, the first, the second, and the third map are created by applying two or more voltages and applying two or more temperatures and measuring the oscillation frequency for different modes of operation and then interpolating and extrapolating the measured oscillation frequencies. In some embodiments, using the inverse maps the equations (1) and (2) are produced and the coefficients $a_{11}$, $a_{12}$, $a_{13}$, $a_{21}$, $a_{22}$, $a_{23}$, $a_{10}$, and $a_{20}$ are determined. In some embodiments, the coefficients $a_{11}$, $a_{12}$, $a_{13}$, $a_{21}$, $a_{22}$, $a_{23}$, $a_{10}$, and $a_{20}$ are determined for a region of the substrate by applying two or more predetermined voltages and applying two or more predetermined temperatures and measuring the oscillation frequencies and using the inverse maps to fit measured data to equations (1) and (2) and determine the coefficients $a_{11}$, $a_{12}$, $a_{13}$, $a_{21}$, $a_{22}$, $a_{23}$, $a_{10}$, and $a_{20}$ for the region of the substrate, e.g., a point in the region of the substrate. In some embodiments, the calibration is used by the analyzer 236 and the equations (1) and (2) or the inverse maps are used by the analyzer 236 when receiving the oscillation frequency 232 to provide the signal 233 that is one of the voltage or the temperature. In some embodiments, the coefficients of the equations (1) and (2) or the inverse maps are stored in the memory of the analyzer 236, e.g., as calibration data.

The subject technology discussed above produces a PVT monitoring device that has a compact area size which is much smaller than the PVT monitoring devices used previously. The embodiments introduced above may be used more frequently in a die and closer to the performance-critical circuits or regions of the semiconductor substrate. The subject technology reduces the need for over designing and may detect socket contact issues or even worst-case resistive drops through the package. The subject technology discussed above occupies a compact area on the substrate compared to existing PVT monitoring devices. Although subject technology discussed above does not use an analog to digital converter (ADC) in the PVT monitoring device, in some implementations the ADC is used.

According to aspects of the subject technology, a device includes a first circuit that generates a first current associated with a voltage of a region of a semiconductor substrate, a second current associated with a temperature of the region of the semiconductor substrate, and a third current associated with a first process parameter of the region of the semiconductor substrate. The device also includes a multiplexer that receives the first current, the second current, and the third current. The multiplexer supplies the first current, the second current, and the third current, one by one and periodically. The device further includes a ring oscillator coupled to the multiplexer that receives the first current, the second current, and the third current, one by one and periodically, from the multiplexer. At each period of time one of the first current, the second current, or the third current is provided to the ring oscillator, and the ring oscillator oscillates at a frequency based on a current received from the multiplexer.

In an aspect of the subject technology, the device further includes a frequency detector coupled to the ring oscillator to detect an oscillation frequency of the ring oscillator and to provide the detected oscillation frequency of the ring oscillator. In an aspect of the subject technology the device further includes an analyzer to receive the detected oscillation frequency of the ring oscillator and to provide a signal associated with the voltage, the temperature, or the first process parameter of the region. In an aspect of the subject technology, the multiplexer is coupled to the first circuit, the multiplexer samples the first current, the second current, and the third current for an equal amount time, and the multiplexer supplies the first current, the second current, and the third current, for the equal amount of time to the ring oscillator. In an aspect of the subject technology, the region includes a performance-critical circuit and the first circuit is arranged in proximity of the performance-critical circuit and when the voltage of the performance-critical circuit is outside a specific voltage range, the performance-critical circuit does not function. In an aspect of the subject technology, the first circuit generates the first current proportional to the voltage of the region and the first circuit generates the second current proportional to a gate-source voltage of a PMOS transistor of the region. In an aspect of the subject technology, the first circuit further generates a fourth current associated with a second process parameter in the region of the semiconductor substrate. The multiplexer receives the first current, the second current, the third current, and the fourth current, and the multiplexer supplies the first current, the second current, the third current, and the fourth current, one by one and periodically, to the ring oscillator.

According to aspects of the subject technology, a semiconductor substrate includes two or more first regions. Each first region includes a circuit that generates a first current associated with one of a voltage or a temperature of a first region of the semiconductor substrate, and a second current associated with a process parameter of the first region of the semiconductor substrate. Each first region also includes a switch that receives the first current and the second current. The switch supplies the first current and the second current, one by one and periodically. Each first region also includes a ring oscillator that is coupled to the switch and receives the first current and the second current, one by one and periodically. The ring oscillator oscillates at a frequency based on the received current.

In an aspect of the subject technology, each first region further includes a frequency detector coupled to the ring oscillator to detect an oscillation frequency of the ring oscillator and to provide the detected oscillation frequency of the ring oscillator, and an analyzer to receive the detected frequency of the ring oscillator and to provide a signal associated with one of the voltage or the temperature, or the process parameter of the first region. In an aspect of the subject technology, the analyzer receives the oscillation frequency of the ring oscillator at two or more voltages and at two or more temperatures, generates a map of the oscillation frequency of the ring oscillator versus voltage variations and temperature variations, and generates an inverse map of the voltage or temperature versus the frequency of the ring oscillator. In an aspect of the subject technology, a first region of the two or more first regions includes one or more of a wideband analog frontend circuit, a high speed sampler circuit, or a high resolution analog to digital converter. In an aspect of the subject technology, the first current is proportional to either a gate-source voltage of a PMOS transistor or the voltage of the first region. In an aspect of the subject technology, an oscillation frequency of the ring oscillator varies between 0.25 GHz and 2.0 GHz. In an aspect of the subject technology, the second current demonstrates a ratio of average speeds of NMOS transistors to PMOS transistors of the first region.

According to aspects of the subject technology, a semiconductor die includes two or more core regions such that each one of the two or more core regions includes two or more first regions and each first region includes a first circuit that generates a first current associated with a voltage of the first region, a second circuit that generates a second current associated with a temperature of the first region, and a third circuit that generates a third current associated with a process parameter of the first region. The first region includes a multiplexer that receives the first current, the second current, and the third current, and the multiplexer supplies the first current, the second current, and the third current, one by one and periodically. The first region further includes a ring oscillator coupled to the multiplexer to receive the first current, the second current, and the third current, one by one and periodically, and the ring oscillator oscillates at an oscillation frequency based on the received current.

In an aspect of the subject technology, each first region further includes a frequency detector coupled to the ring oscillator to detect an oscillation frequency of the ring oscillator and to provide the oscillation frequency. In an aspect of the subject technology, each first region further includes an analyzer coupled to the frequency detector of the first region to receive the oscillation frequency and to generate a first map of a first oscillation frequency of the ring oscillator associated with the first current versus voltage variations and temperature variations, generate a second map of a second oscillation frequency of the ring oscillator associated with the second current versus voltage variations and temperature variations, generate a third map of a third oscillation frequency of the ring oscillator associated with the third current versus voltage variations and temperature variations, generate an inverse of the first map providing the voltage or temperature versus the first oscillation frequency, generate an inverse of the second map providing the voltage or temperature versus the second oscillation frequency, generate an inverse of the third map providing the voltage or temperature versus the third oscillation frequency, and generate a linear equation for each one of the voltage and the temperature vs. the first, second, and third oscillation frequencies, based on the inverse of the first map, the inverse of the second map, and the inverse of the third map. In an aspect of the subject technology, the semiconductor die further includes a logic circuit coupled to the two or more first regions in each core region. The logic circuit controls first circuits, second circuits, and third circuits of the two or more first regions of the core region such that the ring oscillator of each first region generates a signal associated with the voltage, the temperature, or the process parameter of the first region. In an aspect of the subject technology, one or more of the first regions of a core region include one or more high-speed performance-critical circuits. In an aspect of the subject technology, in each first region, the first circuit generates the first current proportional to voltage of the first region, the second circuit generates the second current proportional to a gate-source voltage of a PMOS transistor of a first region, and the process parameter demonstrates a process corner of the first region.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device, comprising:
   a first circuit configured to generate:
      a first current associated with a voltage in a region of a semiconductor substrate;
      a second current associated with a temperature in the region of the semiconductor substrate; and
      a third current associated with a first process parameter in the region of the semiconductor substrate; and
   a multiplexer configured to receive the first current, the second current, and the third current, wherein the multiplexer is configured to supply the first current, the second current, and the third current, one by one and periodically; and
   a ring oscillator coupled to the multiplexer and configured to receive the first current, the second current, and the third current, one by one and periodically, from the multiplexer, wherein at each period of time one of the first current, the second current, or the third current is provided to the ring oscillator, and wherein the ring oscillator is configured to oscillate at a frequency based on a current received from the multiplexer.

2. The device of claim 1, further comprising a frequency detector coupled to the ring oscillator and configured to:
   detect an oscillation frequency of the ring oscillator, and
   provide the oscillation frequency of the ring oscillator.

3. The device of claim 2, further comprising an analyzer configured to:
   receive the oscillation frequency of the ring oscillator and,
   provide a signal associated with the voltage, the temperature, or the first process parameter of the region.

4. The device of claim 1, wherein the multiplexer is coupled to the first circuit, and wherein the multiplexer is configured to sample the first current, the second current, and the third current for an equal amount time and to supply the first current, the second current, and the third current, for an equal amount of time to the ring oscillator.

5. The device of claim 1, wherein the region includes a performance-critical circuit and the first circuit is arranged in proximity of the performance-critical circuit, wherein when the voltage of the performance-critical circuit is outside a specific voltage range, the performance-critical circuit does not function.

6. The device of claim 1, wherein the first circuit is configured to generate the first current proportional to the voltage of the region, and wherein the first circuit is configured to generate the second current proportional to a gate-source voltage of a PMOS transistor of the region.

7. The device of claim 1, wherein the first circuit is further configured to generate a fourth current associated with a second process parameter in the region of the semiconductor substrate, wherein the multiplexer is configured to receive the first current, the second current, the third current, and the fourth current, and wherein the multiplexer is configured to supply the first current, the second current, the third current, and the fourth current, one by one and periodically, to the ring oscillator.

8. A semiconductor substrate, comprising:
two or more first regions on the semiconductor substrate, wherein each first region comprises:
a circuit that is configured to generate:
a first current associated with one of a voltage or a temperature of the first region of the semiconductor substrate; and
a second current associated with a process parameter of the first region of the semiconductor substrate;
a switch coupled to the circuit and configured to receive the first current and the second current, and supply the first current and the second current, one by one and periodically; and
a ring oscillator coupled to the switch and configured to receive the first current and the second current, one by one and periodically, wherein the ring oscillator is configured to oscillate at a frequency based on the received current.

9. The semiconductor substrate of claim 8, wherein each first region further comprises:
a frequency detector coupled to the ring oscillator and configured to detect an oscillation frequency of the ring oscillator and to provide the detected oscillation frequency of the ring oscillator; and
an analyzer configured to receive the oscillation frequency of the ring oscillator and to provide a signal associated with one of the voltage, the temperature, or the process parameter of the first region of the semiconductor substrate.

10. The semiconductor substrate of claim 9, wherein the analyzer is further configured to:
receive the oscillation frequency of the ring oscillator at two or more voltages and at two or more temperatures;
generate a map of the oscillation frequency of the ring oscillator versus voltage variations and temperature variations; and
generate an inverse map of the voltage or temperature versus the frequency of the ring oscillator.

11. The semiconductor substrate of claim 8, wherein a first region of the two or more first regions comprises one or more of a wideband analog frontend circuit, a high speed sampler circuit, or a high resolution analog to digital converter.

12. The semiconductor substrate of claim 8, wherein the first current is proportional to either the voltage of a first region of the two or more first regions or a gate-source voltage of a PMOS transistor.

13. The semiconductor substrate of claim 8, wherein an oscillation frequency of the ring oscillator is configured to vary between 0.25 giga hertz (GHz) and 2.0 GHz.

14. The semiconductor substrate of claim 8, wherein the second current is configured to demonstrate a ratio of average speeds of NMOS transistors to PMOS transistors of a first region of the two or more first regions.

15. A semiconductor die, comprising:
two or more core regions, wherein each one of the two or more core regions comprises two or more first regions, wherein each first region comprises:
a first circuit configured to generate a first current associated with a voltage of the first region;
a second circuit configured to generate a second current associated with a temperature of the first region;
a third circuit configured to generate a third current associated with a process parameter of the first region;
a multiplexer configured to receive the first current, the second current, and the third current, and wherein the multiplexer is configured to supply the first current, the second current, and the third current, one by one and periodically; and
a ring oscillator coupled to the multiplexer and configured to receive the first current, the second current, and the third current, one by one and periodically, wherein the ring oscillator is configured to oscillate at an oscillation frequency based on the received current.

16. The semiconductor die of claim 15, wherein each first region further comprises a frequency detector coupled to the ring oscillator and configured to detect an oscillation frequency of the ring oscillator and to provide the oscillation frequency.

17. The semiconductor die of claim 16, wherein each first region further comprises:
an analyzer coupled to the frequency detector of the first region and configured to receive the oscillation frequency and to:
generate a first map of a first oscillation frequency of the ring oscillator associated with the first current versus voltage variations and temperature variations,
generate a second map of a second oscillation frequency of the ring oscillator associated with the second current versus voltage variations and temperature variations,
generate a third map of a third oscillation frequency of the ring oscillator associated with the third current versus voltage variations and temperature variations,
generate an inverse of the first map providing the voltage or temperature versus the first oscillation frequency,
generate an inverse of the second map providing the voltage or temperature versus the second oscillation frequency,
generate an inverse of the third map providing the voltage or temperature versus the third oscillation frequency, and
generate a linear equation for each one of the voltage and the temperature vs. the first, second, and third oscillation frequencies, based on the inverse of the first map, the inverse of the second map, and the inverse of the third map.

18. The semiconductor die of claim 15, further comprising:
a logic circuit coupled to the two or more first regions in each core region, wherein the logic circuit is configured to control first circuits, second circuits, and third circuits of the two or more first regions of the core region to generate a signal associated with the voltage, the temperature, or the process parameter of the two or more first regions.

19. The semiconductor die of claim 15, wherein one or more of the first regions of a core region comprises one or more high-speed performance-critical circuits.

20. The semiconductor die of claim 15, wherein in each first region, the first circuit is configured to generate the first current proportional to voltage of the first region, wherein the second circuit is configured to generate the second current proportional to a gate-source voltage of a PMOS transistor of a first region, and wherein the process parameter is configured to demonstrate a process corner of the first region.

* * * * *